US012593715B2

(12) United States Patent
Hwang et al.

(10) Patent No.: US 12,593,715 B2
(45) Date of Patent: Mar. 31, 2026

(54) SEMICONDUCTOR DEVICE AND METHOD FOR MANUFACTURING THE SAME

(71) Applicant: Samsung Electronics Co., Ltd., Suwon-si (KR)

(72) Inventors: Hyun Su Hwang, Siheung-si (KR); Jun Yun Kweon, Cheonan-si (KR); Jum Yong Park, Cheonan-si (KR); Sol Ji Song, Suwon-si (KR); Dong Joon Oh, Suwon-si (KR); Chung Sun Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1041 days.

(21) Appl. No.: 17/665,652

(22) Filed: Feb. 7, 2022

(65) Prior Publication Data

US 2023/0021152 A1      Jan. 19, 2023

(30) Foreign Application Priority Data

Jul. 13, 2021     (KR) ........................ 10-2021-0091761

(51) Int. Cl.
*H01L 23/00*          (2006.01)
(52) U.S. Cl.
CPC .............. *H01L 24/05* (2013.01); *H01L 24/03* (2013.01); *H01L 2224/0346* (2013.01); (Continued)
(58) Field of Classification Search
CPC ......... H01L 24/05; H01L 24/03; H01L 24/80; H01L 24/08; H01L 24/11; H01L 24/16; (Continued)

(56) References Cited

U.S. PATENT DOCUMENTS 8,148,807 B2    4/2012  Lee et al.
8,592,991 B2    11/2013  Lee et al.
(Continued)

FOREIGN PATENT DOCUMENTS

KR    10-2016-0065631 A    6/2016
KR    10-2018-0121737 A    11/2018
(Continued)

OTHER PUBLICATIONS

Office Action dated May 29, 2025 issued in corresponding Korean Patent Application No. 10-2021-0091761.
(Continued)

*Primary Examiner* — Dao H Nguyen
(74) *Attorney, Agent, or Firm* — MORGAN, LEWIS & BOCKIUS LLP

(57)          ABSTRACT

A semiconductor device includes an insulating layer on a substrate; a via extending from within the substrate and extending through one face of the substrate and a bottom face of a trench defined in the insulating layer such that a portion of a sidewall and a top face of the via are exposed through the substrate; and a pad contacting the exposed portion of the sidewall and the top face of the via. The pad fills the trench. The insulating layer includes a passivation layer on the substrate, and a protective layer is on the passivation layer. An etch stop layer is absent between the passivation layer and the protective layer. A vertical level of a bottom face of the trench is higher than a vertical level of one face of the substrate and is lower than a vertical level of a top face of the passivation layer.

20 Claims, 15 Drawing Sheets

2

120

1a→

131
133 }130
151
153 }150
155
140
40
35
53 }50
51
33 }30
31

110

1→

10

20

(52) U.S. Cl.
CPC .............. *H01L 2224/03614* (2013.01); *H01L 2224/03622* (2013.01); *H01L 2224/05018* (2013.01); *H01L 2224/05025* (2013.01); *H01L 2224/05083* (2013.01)

(58) Field of Classification Search
CPC . H01L 24/02; H01L 23/5389; H01L 23/5385; H01L 23/485; H01L 23/5226; H01L 2224/05025; H01L 2224/05083; H01L 2224/16146; H01L 2224/02371; H01L 2225/06541; H01L 2225/06548; H01L 2225/06568
See application file for complete search history.

(56) References Cited

U.S. PATENT DOCUMENTS

| | | | | |
|---|---|---|---|---|
| 8,709,936 | B2 * | 4/2014 | Volant | H01L 21/76819 438/667 |
| 8,791,549 | B2 | 7/2014 | Chen et al. | |
| 9,142,517 | B2 * | 9/2015 | Liu | H01L 24/08 |
| 9,806,004 | B2 * | 10/2017 | Lee | H01L 23/5226 |
| 10,910,346 | B2 | 2/2021 | Hong et al. | |
| 11,393,779 | B2 * | 7/2022 | Gao | H01L 23/481 |
| 2010/0140805 | A1 * | 6/2010 | Chang | H01L 24/16 257/E21.538 |
| 2013/0200525 | A1 * | 8/2013 | Lee | H01L 23/481 257/774 |
| 2016/0155686 | A1 * | 6/2016 | Lee | H01L 23/5226 257/737 |
| 2016/0351472 | A1 | 12/2016 | Park et al. | |
| 2017/0221861 | A1 * | 8/2017 | Yu | H01L 21/76895 |
| 2018/0315620 | A1 | 11/2018 | Lee et al. | |
| 2019/0385935 | A1 | 12/2019 | Gao et al. | |
| 2019/0385966 | A1 | 12/2019 | Gao et al. | |

FOREIGN PATENT DOCUMENTS

| | | |
|---|---|---|
| KR | 10-2021-0008917 A | 1/2021 |
| KR | 10-2021-0008918 A | 1/2021 |

OTHER PUBLICATIONS

Notice of Allowance dated Nov. 27, 2025 issued in the corresponding Korean Patent Application No. 10-2021-0091761. (Note: KR 10-2016-0065631 A, and KR 10-2021-0008917 A already submitted.).

* cited by examiner

FIG. 6

SEMICONDUCTOR DEVICE AND METHOD FOR MANUFACTURING THE SAME

CROSS-REFERENCE TO RELATED APPLICATION

This application claims priority from Korean Patent Application No. 10-2021-0091761 filed on Jul. 13, 2021 in the Korean Intellectual Property Office, and all the benefits accruing therefrom under 35 U.S.C. 119, the contents of which in its entirety are herein incorporated by reference.

BACKGROUND

Field

The present inventive concepts relate to a semiconductor device and a method for manufacturing the same.

Description of Related Art

Development of a 3D (3-dimensional) package in which a plurality of semiconductor chips are mounted in a single semiconductor package is in full swing. A TSV (through-silicon-via) that extends through a substrate or a die and acts as a vertical electrical connection is commonly used in the 3D package.

SUMMARY

A technical purpose of the present inventive concepts is to provide a semiconductor device in which reliability of a connection structure between a TSV and a pad is improved, for example based on the connection structure being configured to withstand stress.

Another technical purpose of the present inventive concepts is to provide a method for manufacturing a semiconductor device in which reliability of a connection structure between a TSV and a pad is improved.

Purposes according to the present inventive concepts are not limited to the above-mentioned purpose. Other purposes and advantages according to the present inventive concepts that are not mentioned may be understood based on following descriptions, and may be more clearly understood based on embodiments according to the present inventive concepts. Further, it will be easily understood that the purposes and advantages according to the present inventive concepts may be realized using means shown in the claims and combinations thereof.

According to some example embodiments of the present inventive concepts, a semiconductor device may include a substrate, an insulating layer on one face of the substrate, wherein the insulating layer has one or more inner surfaces at least partially defining a trench in the insulating layer, a via extending from a level within the substrate and extending through the one face of the substrate and a bottom face of the trench such that a portion of a sidewall of the via and a top face of the via are exposed through the substrate, and a pad contacting the exposed portion of the sidewall of the via and the exposed top face of the via, wherein the pad fills the trench. The insulating layer may include a passivation layer on the one face of the substrate, and a protective layer on the passivation layer. An etch stop layer may be absent between the passivation layer and the protective layer such that the passivation layer and the protective layer are in direct contact with each other. A vertical level of the bottom face of the trench maybe higher than a vertical level of the one face of the substrate and may be lower than a vertical level of a top face of the passivation layer.

According to some example embodiments of the present inventive concepts, a semiconductor device may include first and second devices bonded to each other. The first device may include a first substrate, a first insulating layer on a first face of the first substrate, wherein the first insulating layer has one or more inner surfaces at least partially defining a first trench in the first insulating layer, a first via extending from a level within the first substrate and extending through the first face of the first substrate and a first bottom face of the first trench such that a portion of a sidewall of the first via and a top face of the first via are exposed through the first substrate, and a first pad contacting the exposed portion of the sidewall of the first via and the exposed top face of the first via and filling the first trench. The second device may include a second substrate; a second insulating layer on a second face of the second substrate, wherein the second insulating layer has one or more inner surfaces at least partially defining a second trench in the second insulating layer; a second via extending from a level within the second substrate and extending through the second face of the second substrate and a second bottom face of the second trench such that a portion of a sidewall of the second via and a top face of the second via are exposed through the second substrate; and a second pad contacting the exposed portion of the sidewall of the second via and the exposed top face of the second via and filling the second trench. The first insulating layer and the second insulating layer may be bonded to each other, and the first pad and the second pad may be bonded to each other.

According to some example embodiments, a method for manufacturing a semiconductor device may include forming an insulating layer on one face of a substrate, wherein a via is formed in the substrate and the insulating layer, etching the insulating layer to form a trench therein, wherein a portion of a sidewall of the via and a top face of the via are exposed through the trench, and forming a pad so as to contact the exposed top face of the via and the exposed portion of the sidewall of the via and so as to fill the trench.

Specific details of some example embodiments are included in the detailed descriptions and drawings.

BRIEF DESCRIPTION OF DRAWINGS

The above and other aspects and features of the present inventive concepts will become more apparent by describing in detail some example embodiments thereof with reference to the attached drawings, in which:

FIG. 6 is a diagram for illustrating a semiconductor device according to some example embodiments of the present inventive concepts;

DETAILED DESCRIPTION

Figure 1:
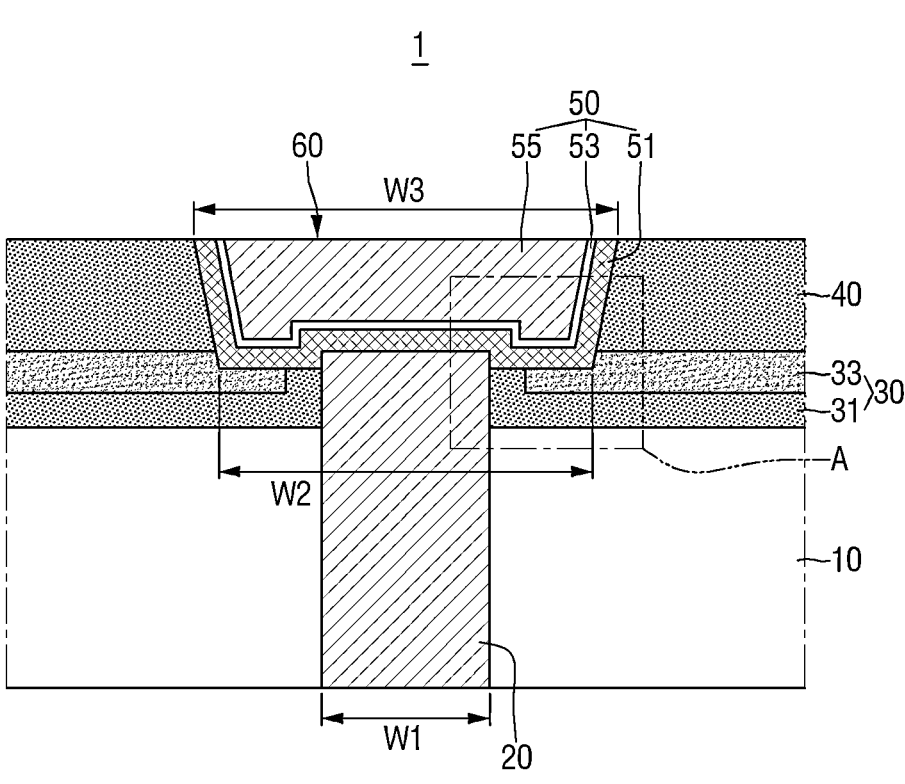
FIG. 1 is a cross-sectional view for illustrating a semiconductor device according to some example embodiments of the present inventive concepts.

Hereinafter, example embodiments of the present inventive concepts will be described in detail with reference to the accompanying drawings. In the drawings, the same components are denoted by the same reference numerals, and redundant description thereof will be omitted.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
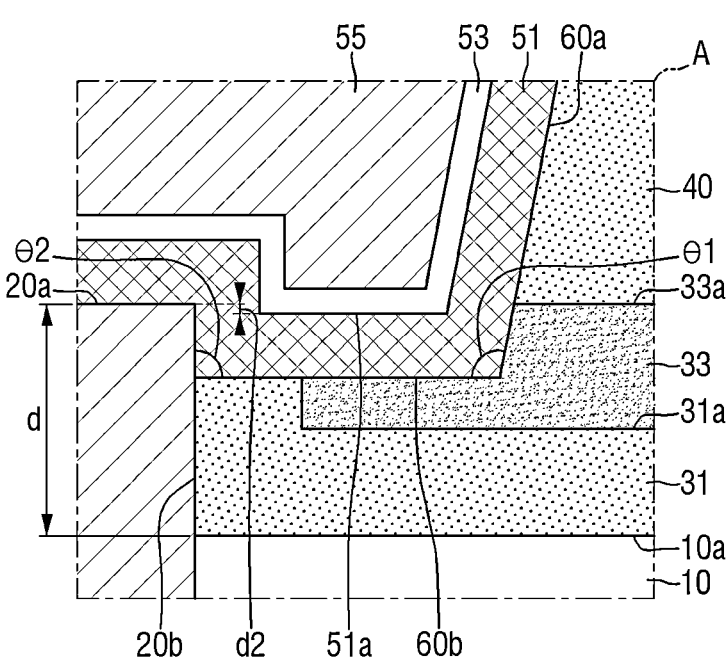
FIG. 2 is an enlarged view of an area A of FIG. 1.

FIG. 1 is a cross-sectional view for illustrating a semiconductor device according to some example embodiments of the present inventive concepts. FIG. 2 is an enlarged view of an area A of FIG. 1.

Referring to FIG. 1 and FIG. 2, a semiconductor device 1 according to some example embodiments of the present inventive concepts may include a substrate 10, a via 20, insulating layers 30 and 40, a pad 50, and the like.

The via 20 may extend through at least a portion of the substrate 10. The via 20 may be embodied as a TSV (through-silicon-via), but may not be limited thereto. The via 20 may be embodied as any line extending in a vertical direction of the substrate 10.

Although not shown separately, the via 20 may be composed of a conductive plug and a conductive barrier film surrounding the conductive plug. For example, the conductive plug may include Cu or W. The conductive plug may be made of, for example, Cu, CuSn, CuMg, CuNi, CuZn, CuPd, CuAu, CuRe, CuW, W, or a W alloy, but may not be limited thereto. The conductive barrier layer may include, for example, at least one material selected from Ti, TiN, Ta, TaN, Ru, Co, Mn, WN, Ni, or NiB. However, the inventive concepts may not be limited thereto.

The insulating layers 30 and 40 may be formed on one face 10a of the substrate 10. A trench 60 may be formed in the insulating layers 30 and 40.

Specifically, the insulating layers 30 and 40 may include a passivation layer 30 formed on one face 10a of the substrate 10 and a protective layer 40 formed on the passivation layer 30. In particular, an etch stop layer is not interposed between the passivation layer 30 and the protective layer 40. For example, the passivation layer 30 and the protective layer 40 may be in direct contact with each other with no interposing layer between the passivation layer 30 and the protective layer 40. As will be described later, the number of manufacturing process steps may be reduced because the etch stop layer is not formed, thereby improving the efficiency and reducing the costs of a method of manufacturing semiconductor devices according to some example embodiments.

As shown, the passivation layer 30 may include a first film 31 formed along (e.g., extending along, extending on, etc.) one face 10a of the substrate 10 and a sidewall 20b of the via 20, and a second film 33 disposed on the first film 31. The first film 31 and the second film 33 may be made of different materials (e.g., may have different total material compositions). For example, the first film 31 may be an oxide film and the second film 33 may be a nitride film. However, the inventive concepts may not be limited thereto.

The trench 60 may be formed in the insulating layers 30 and 40. For example, as shown in at least FIGS. 1-2, the trench 60 may be at least partially defined by one or more inner surfaces or faces of the insulating layers 30 and 40 (where the insulating layers 30 and 40 may be collectively referred to as an insulating layer and may in some example embodiments be a single insulating layer instead of two or more layers). Specifically, the trench may be formed in (e.g., at least partially defined by one or more inner surfaces of) the protective layer 40 and the passivation layer 30. A trench 60 that is "in" the insulating layers 30 and 40 may be understood to at least partially extend through a thickness of the insulating layers 30 and 40, for example as shown in FIG. 1.

A vertical level of a bottom face 60b of the trench 60 (which, as shown in FIG. 1, may be defined by faces of first film 31, second film 33, and via 20) may be higher than a vertical level of one face 10a of the substrate 10 and lower than a vertical level of a top face 33a of the passivation layer 30. Alternatively, the vertical level of the bottom face 60b of the trench 60 may be higher than a vertical level of a bottom 31a of the second film 33, that is, a top face of the first film 31, and lower than a vertical level of the top face 33a of the second film 33.

In the present specification, the term 'level' or 'vertical level' may mean a vertical height and/or a distance from a reference location (e.g., the top surface and/or bottom surface of the substrate 10) in a vertical direction (e.g., a vertical direction that extends perpendicular or substantially perpendicular to the top surface and/or bottom surface of the substrate 10). Therefore, when a first element is described herein to be at a higher level or vertical level than a second element, the first element may be further from the bottom surface of the substrate 10 in the vertical direction that extends perpendicular or substantially perpendicular to the bottom surface of the substrate 10 than the second element. Furthermore, when a first element is described herein to be at a lower vertical level than a second element, the first element may be closer to the bottom surface of the substrate 10 in the vertical direction that extends perpendicular or substantially perpendicular to the bottom surface of the substrate 10 than the second element. Furthermore, when a first element is described herein to be at a same or substantially same level as a second element, the first element may be equally distant from/close to the bottom surface of the substrate 10 in the vertical direction that extends perpendicular or substantially perpendicular to the bottom surface of the substrate 10 as the second element.

Further, an angle $\theta1$ between the bottom face 60b of the trench 60 (which, as shown in FIGS. 1-2, may be defined by faces of first film 31, second film 33, and via 20) and the side face 60a of the trench 60 (which, as shown in FIGS. 1-2, may be defined by faces of the protection layer 40 and second film 33) may be a first angle that may be an obtuse angle. For example, the angle $\theta1$ between the bottom face 60b and the side face 60a of the trench 60 may be greater than 90° and smaller than 110°.

Further, the via 20 may protrude upwardly beyond one face 10a of the substrate 10 (refer to a reference numeral d in FIG. 2). That is, the via 20 may extend through one face 10a of the substrate 10 (e.g., the top surface of the substrate 10) and the bottom face 60b of the trench 60, so that a portion of a sidewall 20b of the via 20 and a top face 20a thereof may be exposed through the substrate 10.

In this connection, an angle $\theta2$ between the exposed sidewall 20b of the via 20 and the bottom face 60b of the trench 60 may be a second angle that may be a right angle or a substantially right angle. For example, the angle $\theta2$ may be in a range of 85° to 90°.

The angle $\theta1$ between the bottom face 60b and the side face 60a of the trench 60 (e.g., the first angle) may be greater than the angle $\theta2$ between the exposed sidewall 20b of the via 20 and the bottom face 60b of the trench 60 (e.g., the second angle).

The pad 50 may contact the exposed portion of the sidewall 20b of the via 20 and the exposed top face 20a thereof, and may fill (e.g., completely fill) the trench 60.

The pad 50 may include a barrier layer 51, a seed layer 53 and a plated layer 55. For example, the barrier layer 51 may be formed conformally along the side face 60a and bottom face 60b of the trench 60, and the exposed sidewall 20b and top face 20a of the via 20. The barrier layer 51 may include at least one material selected from Ti, TiN, Ta, TaN, Ru, Co, Mn, WN, Ni, or NiB. The seed layer 53 may be formed on the barrier layer 51, and may be formed conformally along a profile of the barrier layer 51. The plated layer 55 may be formed on the barrier layer 51 and may fill the trench 60. The plated layer 55 may be made of Cu, CuSn, CuMg, CuNi, CuZn, CuPd, CuAu, CuRe, CuW, W, or a W alloy, but may not be limited thereto.

Because the angle $\theta1$ between the bottom face 60b and the side face 60a of the trench 60 is an obtuse angle, each of an angle between a bottom face and a side face of the barrier layer 51 and an angle between a bottom face and a side face of the seed layer 53 is an obtuse angle.

In one example, at least a portion of the top face 51a of the barrier layer 51 is positioned below the top face 20a of the via 20 (see a reference numeral d2). In other words, at least a portion of an interface between the barrier layer 51 and the seed layer 53 is located below the top face 20a of the via 20. For example, d2 may be in a range of 0 to 1 μm, but may not be limited thereto.

As illustrated, a top face 33a of the passivation layer 30 and the top face 20a of the via 20 may be coplanar with each other. This is because during a manufacturing process, the passivation layer 30 is formed along one face 10a of the substrate 10 and the exposed sidewall 20b and top face 20a of the via 20 and then the passivation layer 30 is planarized.

In one example, the via 20 may have a first width W1, the pad 50 may have a second width W2 at the lowest face of the pad 50 which may be greater than the first width W1, and the pad 50 may have a third width W3 at the topmost face of the pad 50 which may be greater than the second width W2. Because the third width W3 is sufficiently large (that is, because the third width W3 is greater than the second width W2), the pad 50 may be in stable contact with a pad of another device.

The pad 50 may surround a portion of the sidewall 20b of the via 20 and the top face 20a thereof. That is, the pad 50 has a structure that locks the via 20. Therefore, because the pad 50 and the via 20 are stably coupled to each other, the pad 50 and the via 20 may not be removed from each other under presence of a horizontal stress. As a result, a reliability of a connection structure between via 20 and pad 50 is improved, such that reliability and thus performance of a semiconductor device 1 may be improved based on having such connection structure.

Figure 3:
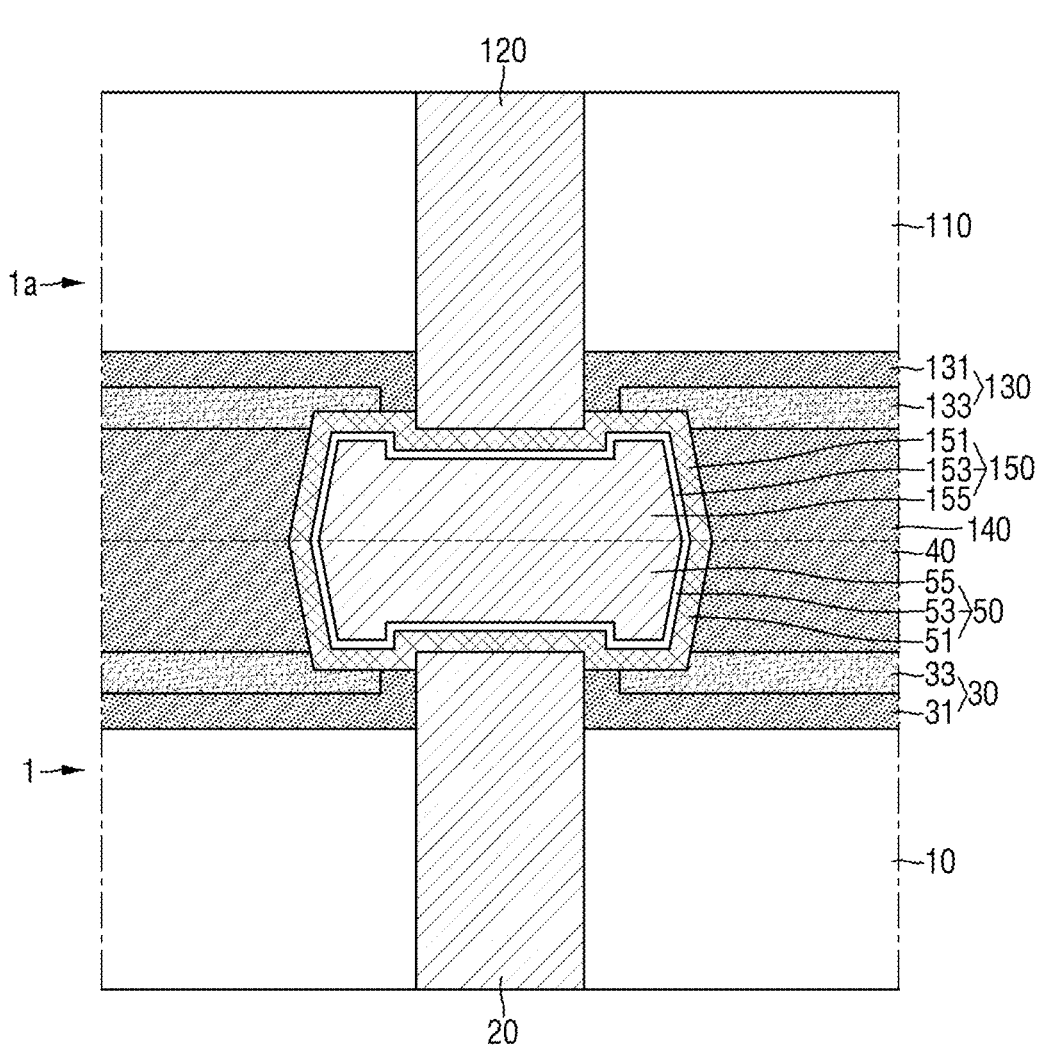
FIG. 3 is a diagram for illustrating a semiconductor device according to some example embodiments of the present inventive concepts.
Figure 4:
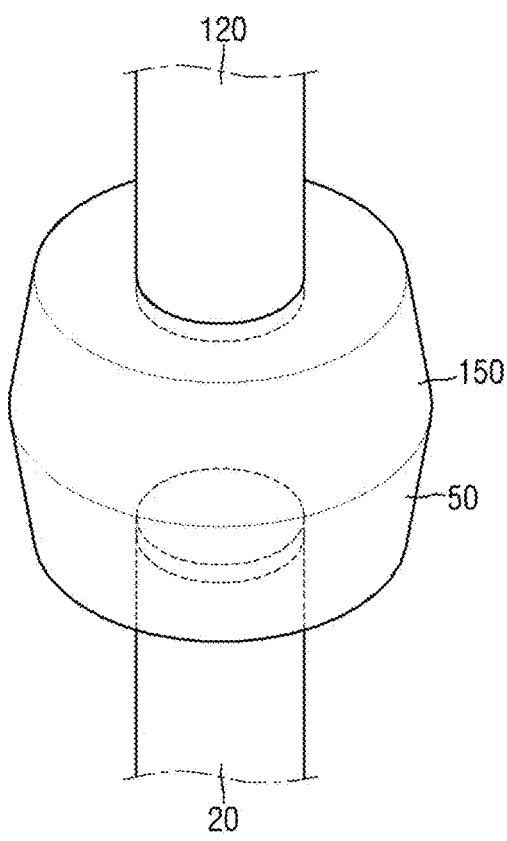
FIG. 4 is a conceptual diagram for illustrating the semiconductor device of FIG. 3.

FIG. 3 is a diagram for illustrating a semiconductor device according to some example embodiments of the present inventive concepts. FIG. 4 is a conceptual diagram for illustrating the semiconductor device of FIG. 3. For convenience of description, following descriptions are mainly based on differences thereof from the description with reference to FIG. 1 and FIG. 2.

Referring to FIG. 3 and FIG. 4, a semiconductor device 2 according to some example embodiments of the present inventive concepts has a structure in which a first device 1 and a second device 1a are bonded to each other. Each of the first device 1 and the second device 1a may correspond to the semiconductor device shown in FIG. 1.

The first device 1 includes first insulating layers 30 and 40, a first via 20, and a first pad 50. The first insulating layers 30 and 40 may be formed on a first face of a first substrate 10, and include a first trench. As shown in FIG. 3, the first trench may be at least partially defined by one or more inner surfaces or faces of the first insulating layers 30 and 40 (which may be collectively referred to as a first insulating layer and may in some example embodiments be a single insulating layer instead of two or more layers). The first via 20 may extend from a level within the first substrate 10 and extend through a first face of the first substrate 10 and a first bottom face of the first trench, so that a portion of a first sidewall and a first top face thereof are exposed. The first pad 50 may be in contact with the exposed portion of the first sidewall of the first via 20 and the exposed first top face thereof. The first pad 50 fills the first trench.

The second device 1a includes second insulating layers 130 and 140, a second via 120, and a second pad 150. The second insulating layers 130 and 140 may be formed on a second face of the second substrate 110, and include a second trench. As shown in FIG. 3, the second trench may be at least partially defined by one or more inner surfaces or faces of the second insulating layers 130 and 140 (which may be collectively referred to as a second insulating layer and may in some example embodiments be a single insulating layer instead of two or more layers). The second via 120 may extend from a level within the second substrate 110 and extend through the second face of the second substrate 110 and a second bottom face of the second trench, so that a portion of a second sidewall and a second top face thereof are exposed. The second pad 150 may be in contact with the exposed portion of the second sidewall of the second via 120 and the exposed second top face thereof and fill the second trench.

The first insulating layers 30 and 40 may be bonded to the second insulating layers 130 and 140. The first pad 50 and the second pad 150 may be bonded to each other. That is, the semiconductor device 2 according to some example embodiments of the present inventive concepts has a hybrid bond structured in which insulating material layers are bonded to each other and conductive material layers are bonded to each other. Such hybrid bonding may provide a connection structure in the semiconductor device 2 that has improved reliability, such that reliability and thus performance of a semiconductor device 2 may be improved based on having such a hybrid bonding structure.

The first insulating layers 30 and 40 include a first passivation layer 30 and a first protective layer 40 formed on the first passivation layer 30. A top face of the first passivation layer 30 and a top face of the first via 20 may be coplanar with each other. A vertical level of a bottom face of the first trench is higher than a vertical level of the first face of the first substrate 10 and lower than a vertical level of the top face of the first passivation layer 30. The first passivation layer 30 includes a first film 31 formed along one face of the first substrate 10 and a side face of the first via 20, and a second film 33 disposed on the first film 31. For example, the first film 31 may be an oxide film, and the second film 33 may be a nitride film. A vertical level of a bottom face of the first trench is higher than a vertical level of a bottom of the second film 33 and lower than a vertical level of a top face of the second film 33.

Similarly, the second insulating layers 130 and 140 include a second passivation layer 130 and a second protective layer 140 formed on the second passivation layer 130. A top face of the second passivation layer 130 and a top face of the second via 120 may be coplanar with each other. A vertical level of a bottom face of the second trench is higher than a vertical level of a second face of the second substrate 110, and lower than a vertical level of a top face of the second passivation layer 130. The second passivation layer 130 includes a third film 131 formed along one face of the second substrate 110 and a side face of the second via 120, and a fourth film 133 disposed on the third film 131. For example, the third film 131 may be an oxide film, and the fourth film 133 may be a nitride film. A vertical level of a bottom face of the second trench is higher than a vertical level of a bottom of the fourth film 133, and lower than a vertical level of a top face of the fourth film 133.

The first pad 50 includes a first barrier layer 51, a first seed layer 53, and a first plated layer 55. The second pad 150 includes a second barrier layer 151, a second seed layer 153, and a second plated layer 155.

At least a portion of a top face of the first barrier layer 51 is positioned below (e.g., at a lower level than) a top face of the first via 20. At least a portion of a top face of the second barrier layer 151 is positioned below a top face of the second via 120.

As shown, an angle between a first bottom face and a first side face of the first trench may be an obtuse angle, and an angle between a second bottom face and a second side face of the second trench may be an obtuse angle. The angle between the first bottom face and the first side face of the first trench may be greater than an angle between an exposed sidewall of the first via 20 and the first bottom face of the first trench. The angle between the second bottom face and the second side face of the second trench may be greater than an angle between an exposed sidewall of the second via 120 and the second bottom face of the second trench.

In one example, the first device 1 may act as (e.g., may include) a wafer or a die, while the second device 1*a* may act as (e.g., may include) a wafer or a die. For example, when the first device 1 acts as a wafer and the second device 1*a* acts as a die, D2W (Die to Wafer) hybrid bonding is achieved. When the first device 1 acts as a wafer and the second device 1*a* acts as a wafer, W2 W (Wafer to Wafer) hybrid bonding is achieved. When the first device 1 acts as a die, and the second device 1*a* acts as a die, D2D (Die to Die) hybrid bonding is achieved.

Figure 5:
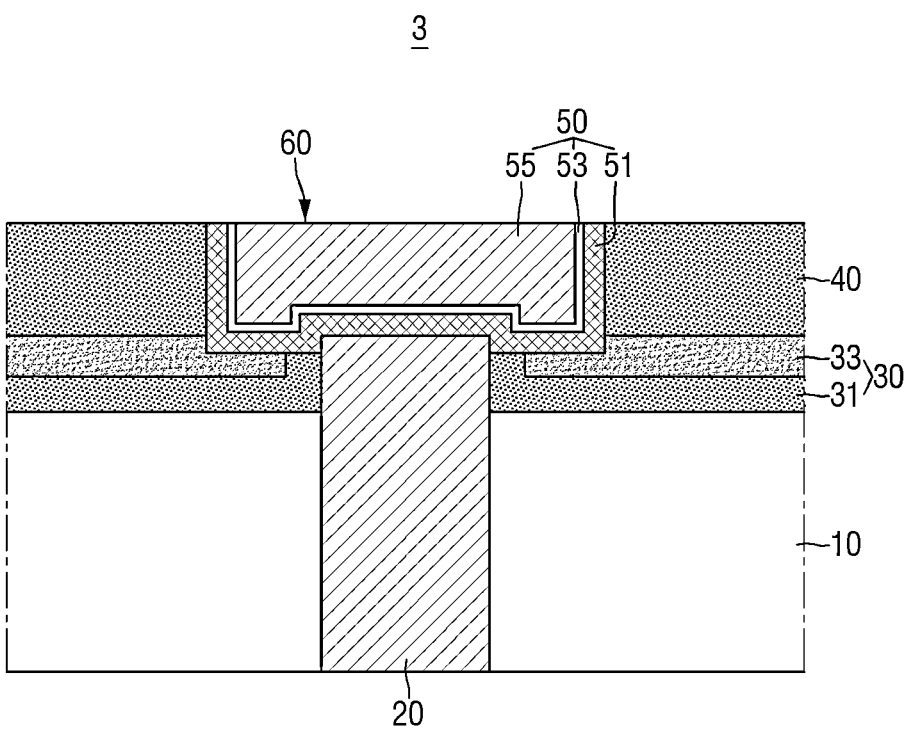
FIG. 5 is a diagram for illustrating a semiconductor device according to some example embodiments of the present inventive concepts.
Figure 6:
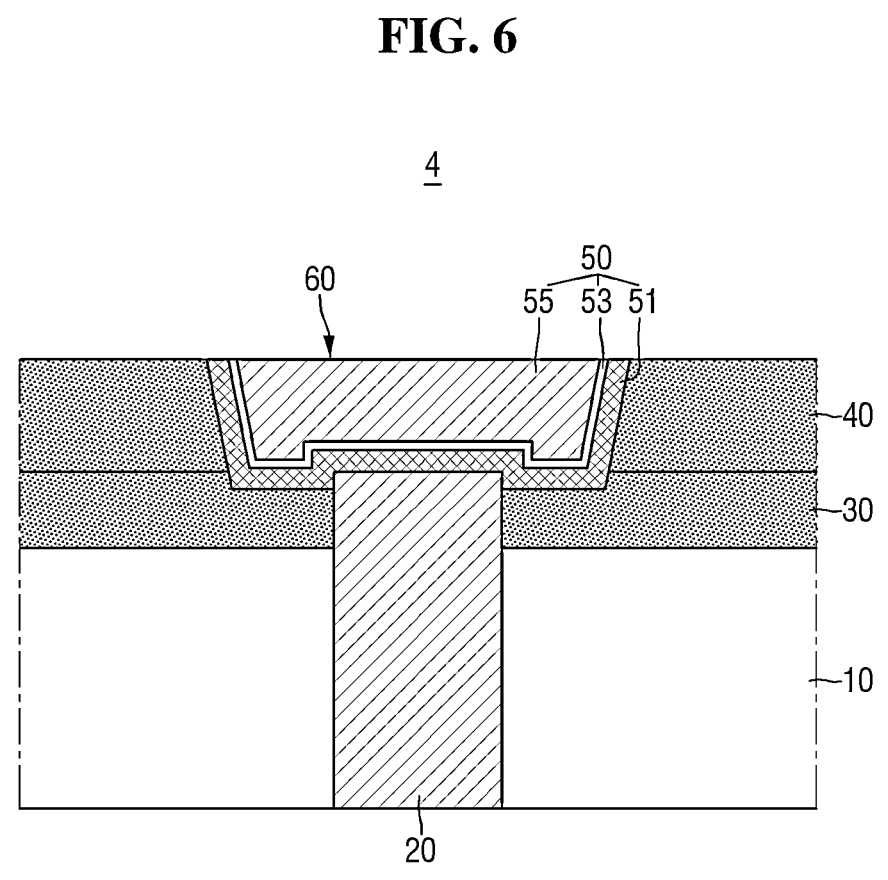

FIG. 5 is a diagram for illustrating a semiconductor device according to some example embodiments of the present inventive concepts. FIG. 6 is a diagram for illustrating a semiconductor device according to some example embodiments of the present inventive concepts. For convenience of description, following descriptions are mainly based on differences from thereof the description with reference to FIG. 1 and FIG. 2.

Referring to FIG. 5, in a semiconductor device 3 according to some example embodiments of the present inventive concepts, an angle between a bottom face and a side face of the trench 60 may be substantially right (e.g., may be 90 degrees or substantially 90 degrees), and may not be an obtuse angle. Referring to FIG. 6, in a semiconductor device 4 according to some example embodiments of the present inventive concepts, the insulating layer 30 may be composed of one layer instead of two or more layers.

FIG. 7, 8, 9, 10, 11, and FIG. 12 are diagrams showing a semiconductor package to which the above-described semiconductor device according to any of the example embodiments is applied.

Figure 7:
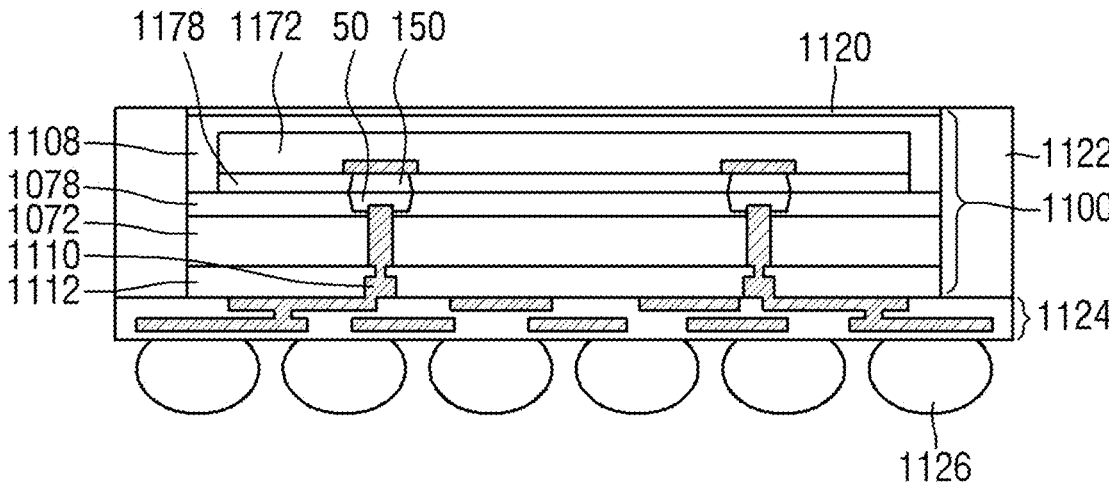
FIG. 7 is a diagram for illustrating a semiconductor package according to some example embodiments of the present inventive concepts.

FIG. 7 is a diagram for illustrating a semiconductor package according to some example embodiments of the present inventive concepts.

Referring to FIG. 7, the illustrated semiconductor package is embodied as a chip-on-wafer (CoW) package. A conductive connector 1126 is formed on an opposite face of a redistribution structure 1124. The conductive connector 1126 may be embodied as a ball grid array (BGA) connector, a solder ball, a metal pillar, a C4 (controlled collapse chip connection) bump, a micro bump, a bump formed by ENEPIG (electroless nickel electroless palladium immersion gold) technique, or the like. The conductive connector 1126 may include a conductive material such as solder, copper, aluminum, gold, nickel, silver, palladium, tin, etc., or combinations thereof. In some example embodiments, the conductive connector 1126 may be formed by initially forming a solder layer using a commonly used method such as evaporation, electroplating, printing, solder transfer, ball placement, and the like. Once the solder layer has been formed on a structure, reflow may be performed to shape a material the solder layer into a desired bump shape.

The insulating layer 1112 may be disposed on one face of the redistribution structure 1124, and may be made of a silicon-containing insulator such as silicon nitride, silicon oxide, or silicon oxynitride. The insulating layer 1112 may be formed using an appropriate deposition method such as spin coating, CVD, PECVD, or HDP-CVD. A conductive pillar 1110 is formed in the insulating layer 1112. The conductive pillar 1110 is electrically connected to the redistribution structure 1124.

A via (or TSV or a through electrode) is installed in the substrate 1072. An insulating film 1078 is formed on one face of the substrate 1072. A first pad 50 is formed on one end of the via of the substrate 1072. A second pad 150 is formed on one face of a substrate 1172. An insulating film 1178 is formed on one face of the substrate 1172 so as to surround a second pad 150. The first pad 50 and the second pad 150 may be bonded to each other. The insulating film 1078 and the insulating film 1178 are bonded to each other.

A sealant 1108 is formed to surround the substrate 1172. The sealant 1108 may include a molding compound, epoxy, or the like. The sealant 1122 is formed on a top face of the redistribution structure 1124 and surrounds side faces of the substrates 1072 and 1172.

An adhesive 1120 may be disposed on the sealant 1108. The adhesive 1120 may be embodied as any suitable adhesive, epoxy, a die attach film (DAF), or the like.

A reference numeral 1100 denotes an intermediate package.

Figure 8:
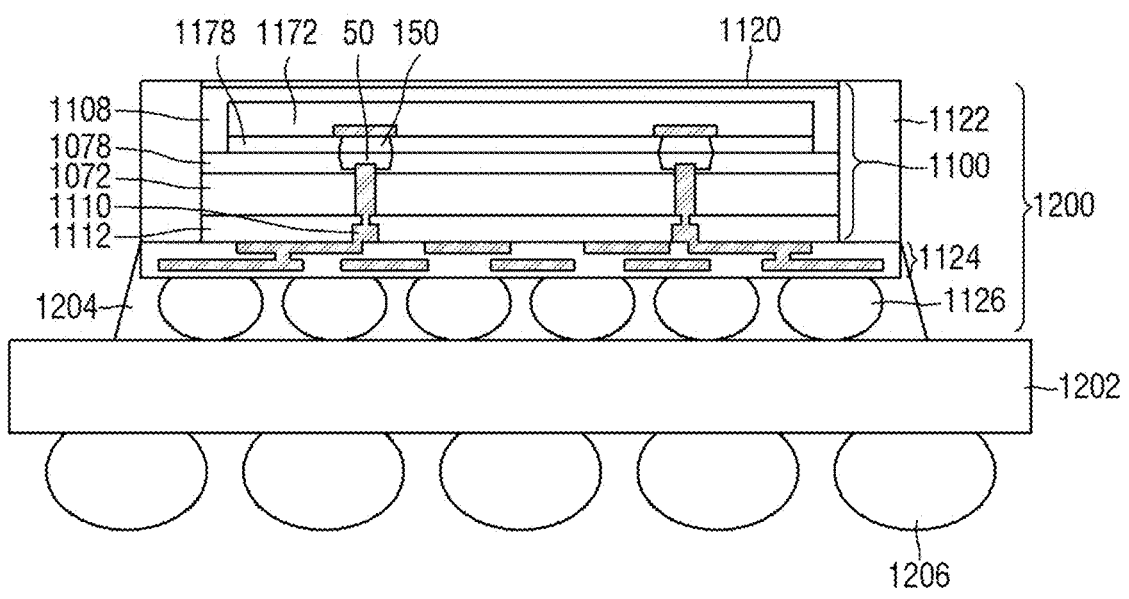
FIG. 8 is a diagram for illustrating a semiconductor package according to some example embodiments of the present inventive concepts.

FIG. 8 is a diagram for illustrating a semiconductor package according to some example embodiments of the present inventive concepts. For convenience of description, following descriptions are mainly based on differences thereof from the description with reference to FIG. 7.

Referring to FIG. 8, the semiconductor package shown in FIG. 8 is embodied as the semiconductor package shown in FIG. 7 mounted on a package substrate 1202.

The package substrate 1202 may be made of a semiconductor material such as silicon and germanium. In one example, the package substrate 1202 may be made of a compound material such as silicon germanium, silicon carbide, gallium arsenide, indium arsenide, indium phosphide, silicon germanium carbide, gallium arsenide phosphide, gallium indium phosphide, and combinations thereof. Additionally, the package substrate 1202 may be embodied as an SOI substrate. In general, the SOI substrate includes a layer made of a semiconductor material such as epitaxial silicon, germanium, silicon germanium, SOI, SGOI, or combinations thereof. In some example embodiments, the package substrate 1202 is based on an insulating core such as a glass fiber reinforced resin core. An example of the core material may be a glass fiber resin, such as FR4. An alternative example of the core material may include a BT (bismale-imide-triazine) resin or another PCB material or film. A buildup film such as ABF or another laminate may be used as the package substrate 202.

The package substrate 1202 may include active and passive devices. Those skilled in the art will recognize that a variety of devices including transistors, capacitors, resistors, and combinations thereof may be used to create structural and functional requirements of a design of the package 1200. The device may be formed using any suitable method. In some example embodiments, the package substrate 1202 may be substantially free of the active and passive devices.

The package substrate 1202 may include a metallized layer and a via, and a bond pad on the metallized layer and the via. The metallized layer may be formed on the active and passive devices and may be designed to connect various devices to each other to form a functional circuit. The metallized layer may be composed of a stack in which dielectric layers (e.g., a low-k dielectric material) and conductive material layers (e.g., copper) are alternately stacked, wherein the via connects the conductive material layers to each other. The metallized layer may be formed using any suitable process such as deposition, damascene, dual damascene, etc.

An underfill 1204 may be formed between a package 1200 and the package substrate 1202 so as to surround a conductive connector 1126. The underfill 1204 may be formed using a capillary flow process after the package 1200 is attached, using a suitable deposition method before the package 1200 is attached. The conductive connector 1206 may be embodied as, for example, a BGA connector, and may include a conductive material such as solder, copper, aluminum, gold, nickel, silver, palladium, tin, the like, or combinations thereof.

Figure 9:
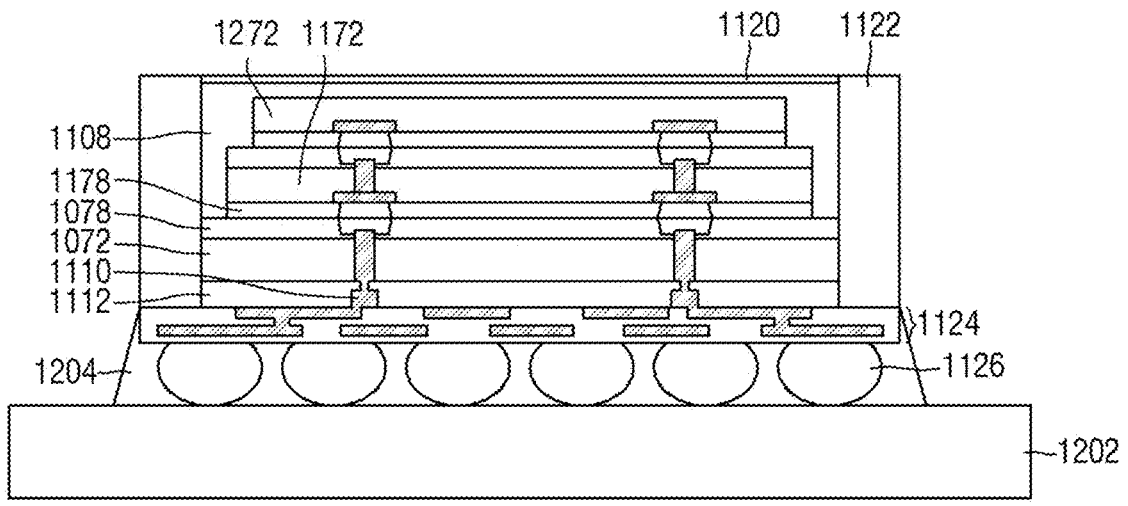
FIG. 9 is a diagram for illustrating a semiconductor package according to some example embodiments of the present inventive concepts.

FIG. 9 is a diagram for illustrating a semiconductor package according to some example embodiments of the present inventive concepts. For convenience of description, following descriptions are mainly based on differences thereof from the description with reference to FIG. 7 and FIG. 8.

The semiconductor package in FIG. 8 has a structure in which the two substrates 1072 and 1172 are stacked on the redistribution structure 1124, whereas the semiconductor package in FIG. 9 has a structure in which three or more substrates 1072, 1172, and 1272 are stacked on the redistribution structure 1124. The sealant 1108 is formed to surround the substrates 1172 and 1272.

Figure 10:
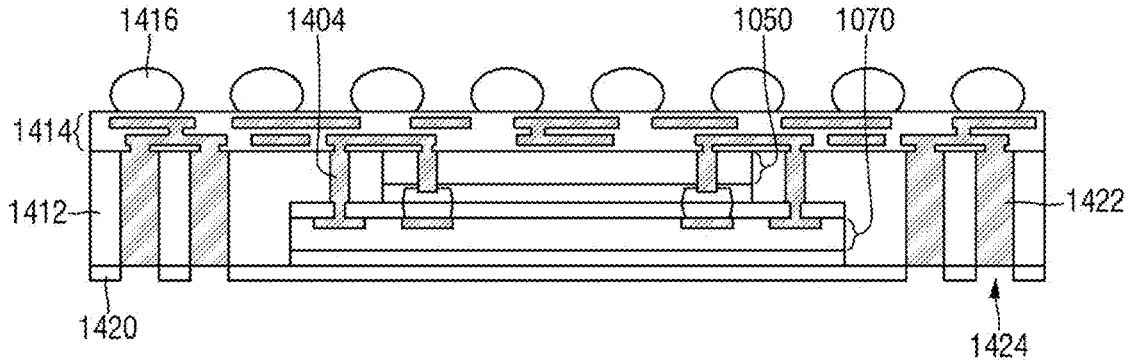
FIG. 10 is a diagram for illustrating a semiconductor package according to some example embodiments of the present inventive concepts.

FIG. 10 is a diagram for illustrating a semiconductor package according to some example embodiments of the present inventive concepts.

Referring to FIG. 10, a conductive connector 1416 is disposed on an opposite face of a redistribution structure 1414. Integrated circuit devices 1050 and 1070 are stacked on one face of the redistribution structure 1414. The sealant 1412 surrounds the integrated circuit devices 1050 and 1070 in a sealing manner Vertical lines 1404 and 1422 extending through the sealant 1412 are formed. The vertical line 1404 directly connects the redistribution structure 1414 and the integrated circuit device 1070 to each other. The vertical line 1422 extends through an entirety of the sealant 1412 and is connected to the redistribution structure 1414. A dielectric layer 1420 may be formed on the sealant 1412. The dielectric layer 1420 may have an opening 1424 defined therein exposing the vertical line 1422.

Figure 11:
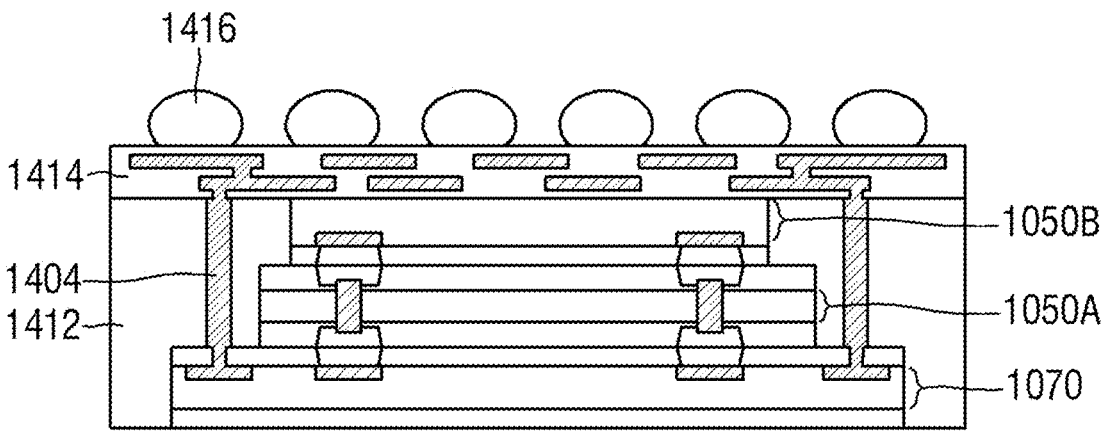
FIG. 11 is a diagram for illustrating a semiconductor package according to some example embodiments of the present inventive concepts.

FIG. 11 is a diagram for illustrating a semiconductor package according to some example embodiments of the present inventive concepts. For convenience of description, following descriptions are mainly based on differences thereof from the description with reference to FIG. 10.

The semiconductor package in FIG. 10 has a structure in which the two integrated circuit devices 1050 and 1070 are stacked on the redistribution structure 1414, whereas the semiconductor package in FIG. 11 has a structure in which three or more integrated circuit devices 1050A, 1050B, and 1070 are stacked on the redistribution structure 1414. The sealant 1412 is formed to surround integrated circuit devices 1050A, 1050B, and 1070.

Hereinafter, a method for manufacturing the semiconductor device according to some example embodiments of the present inventive concepts will be described with reference to FIG. 12 to FIG. 18 and FIG. 1.

FIGS. 12, 13, 14, 15, 16, 17, and 18 are diagrams of intermediate steps for illustrating the method for manufacturing the semiconductor device according to some example embodiments of the present inventive concepts.

Figure 12:
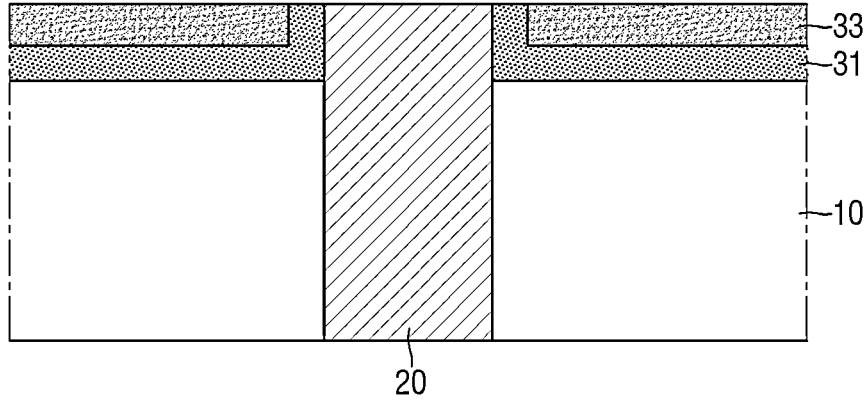
FIG. 12, 13, 14, 15, 16, 17, and FIG. 18 are diagrams of intermediate steps for illustrating a method for manufacturing the semiconductor device according to some example embodiments of the present inventive concepts.

Referring to FIG. 12, the via 20, for example, the TSV is formed in the substrate 10. The via 20 protrudes from one face of the substrate 10. The first film 31 is formed conformally along the sidewall portion of the via 20 and one face of the substrate 10. The second film 33 is formed on the first film 31. For example, the first film 31 may be an oxide film, and the second film 33 may be a nitride film. The inventive concepts may not be limited thereto. The first film 31 and the second film 33 constitute the passivation layer.

Figure 13:
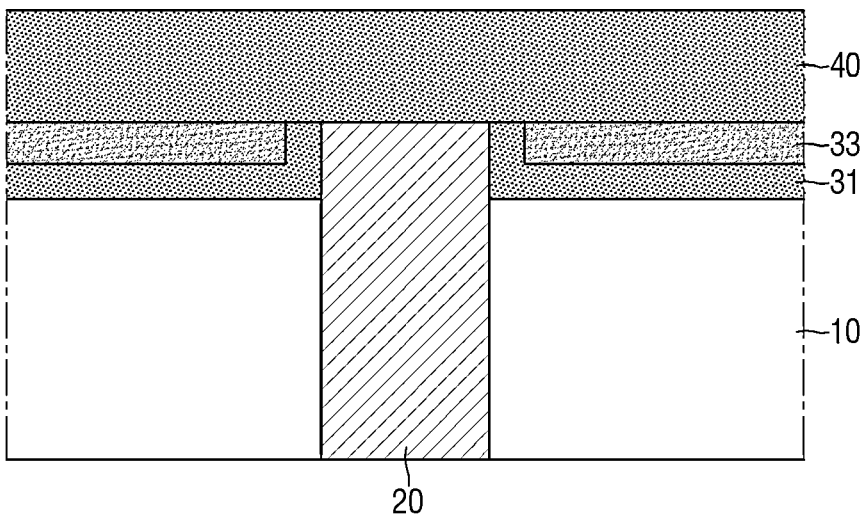

Referring to FIG. 13, the protective layer 40 is formed on a resulting structure of FIG. 12. The protective layer 40 may be an oxide film, but may not be limited thereto. In this connection, no etch stop layer is interposed between the passivation layer and the protective layer 40, for example such that the passivation layer and the protective layer 40 are in direct contact with each other. Accordingly, an insulating layer (e.g., comprising the first film 31, second film 33, and protective layer 40) may be formed on one face of the substrate 10, wherein a via 20 is formed in the substrate 10 and the insulating layer. As shown in FIGS. 12-13, forming the insulating layer on one face of the substrate 10 may include forming a passivation layer (e.g., a combination of the first film 31 and the second film 33) on one face of the substrate 10, wherein at least a portion of a sidewall of the via 20 that is exposed through the substrate 10 is covered with the passivation layer and the top face of the via 20 may be exposed through the passivation layer; and forming a protective layer 40 on the passivation layer and the top face of the via 20.

Figure 14:
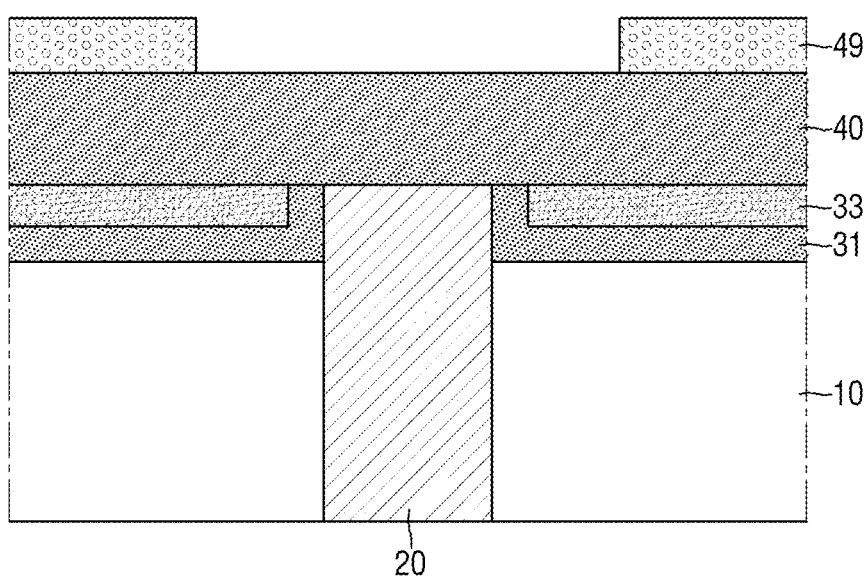

Referring to FIG. 14, a mask pattern 49 is formed on the protective layer 40 (e.g., on a top face of the protective layer 40).

Figure 15:
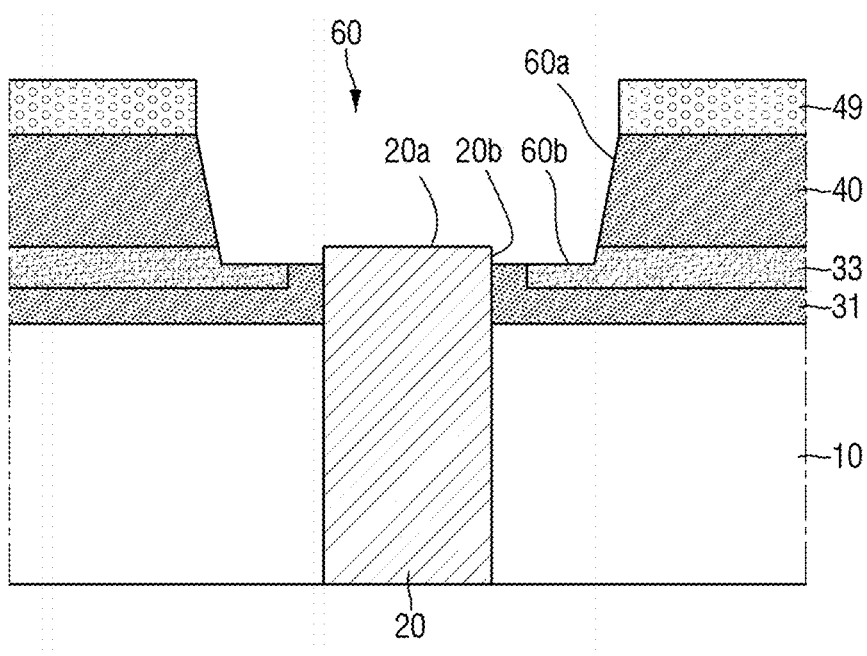

Referring to FIG. 15, the trench 60 may be formed based on etching the protective layer 40 and the passivation layer, including the first and second films 31 and 33 (e.g., etching the insulating layer), using the mask pattern 49 to expose a portion of a sidewall 20b of the via 20 and the top face 20a of the via 20. That is, the protective layer 40 and the passivation layers (e.g., first and second films 31 and 33) may be over-etched so that the portion of the sidewall 20b of the via 20 and the top face 20a of the via 20 are exposed (e.g., exposed through the trench 60). As shown, the angle between the bottom face 60b and the side face 60a of the trench 60 may be a first angle, which may be an obtuse angle. The angle between the bottom face 60b and the side face 60a of the trench 60 (e.g., the first angle) may be greater than the angle between the exposed sidewall 20b of the via 20 and the bottom face 60b of the trench 60 (e.g., a second angle).

Figure 16:
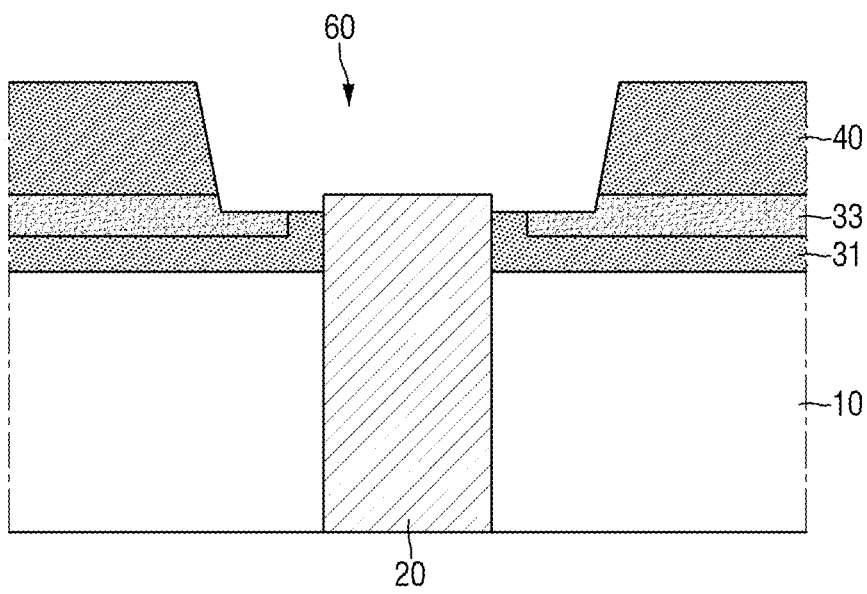

Referring to FIG. 16, the mask pattern 49 is removed.

Figure 17:
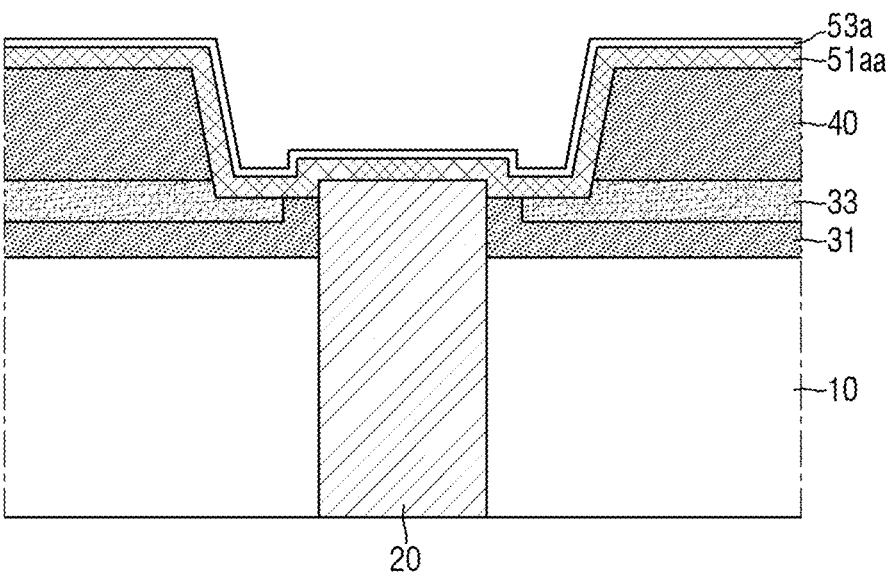

Referring to FIG. 17, the barrier layer 51aa is formed conformally along a top face of protective layer 40, the bottom face 60b and the side face 60a of the trench 60, and the exposed sidewall 20b and top face 20a of the via 20. On the barrier layer 51aa, a seed layer 53a is formed along the profile of the barrier layer 51aa.

Figure 18:
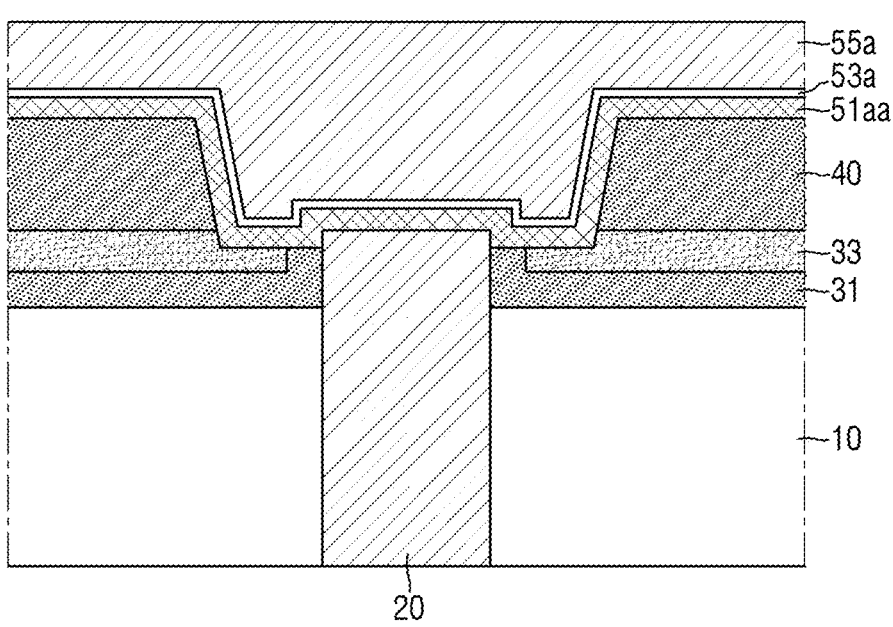

Referring to FIG. 18, a plated layer 55a is formed on the seed layer 53a.

Referring to FIG. 1 again, a top face of the protective layer 40 is planarized so that a top face of the pad is exposed. Thus, the pad 50 is completed.

In the method for manufacturing the semiconductor device according to some example embodiments of the present inventive concepts, the etch stop layer is not formed. Thus, the manufacturing process may be simplified and thus the method may provide reduced costs for manufacturing semiconductor devices. That is, a step of forming the etch stop layer and a step of removing a remaining portion of the etch stop layer after the etching may be omitted.

Figure 19:
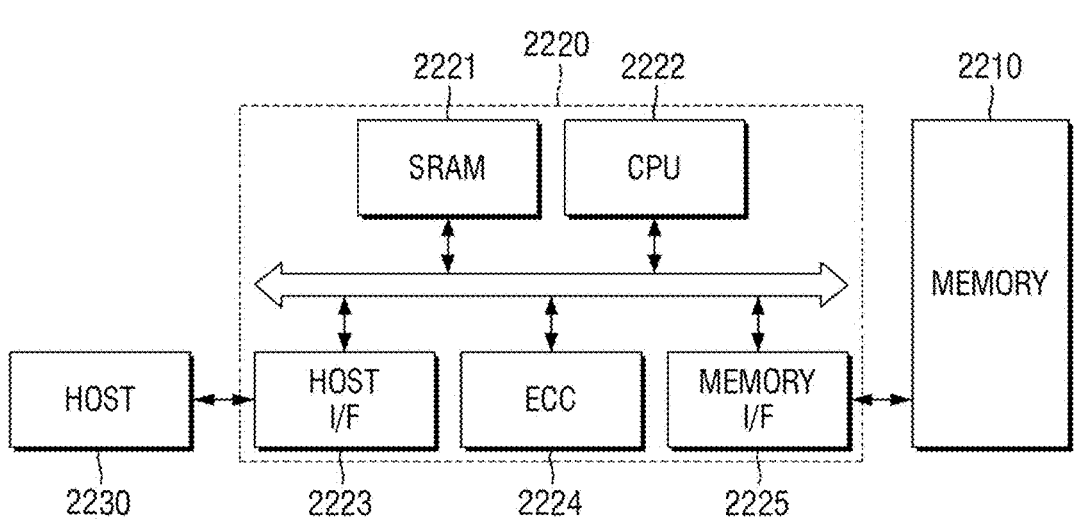
FIG. 19 is a block diagram illustrating a memory card having a semiconductor package according to some example embodiments of the present inventive concepts.

FIG. 19 is a block diagram illustrating a memory card having a semiconductor package according to some example embodiments of the present inventive concepts.

Referring to FIG. 19, the semiconductor devices/packages according to some example embodiments of the present inventive concepts may be applied to a memory card 2200.

The memory card 2200 may include a memory controller 2220 that controls data exchange between a host 2230 and a memory 2210. A SRAM 2221 may be used as an operation memory of a central processing unit 2222. A host interface 2223 may have a data exchange protocol of the host 2230 connected to the memory card 2200. An error correction code 2224 may detect and correct an error contained in data read from the memory 2210. A memory interface 2225 may interface with the memory 2210. The central processing unit 2222 may perform various control operations for data exchange of the memory controller 2220.

For example, at least one of the memory 2210 or the central processing unit 2222 may include at least one of the semiconductor devices/packages according to some example embodiments of the present inventive concepts.

Figure 20:
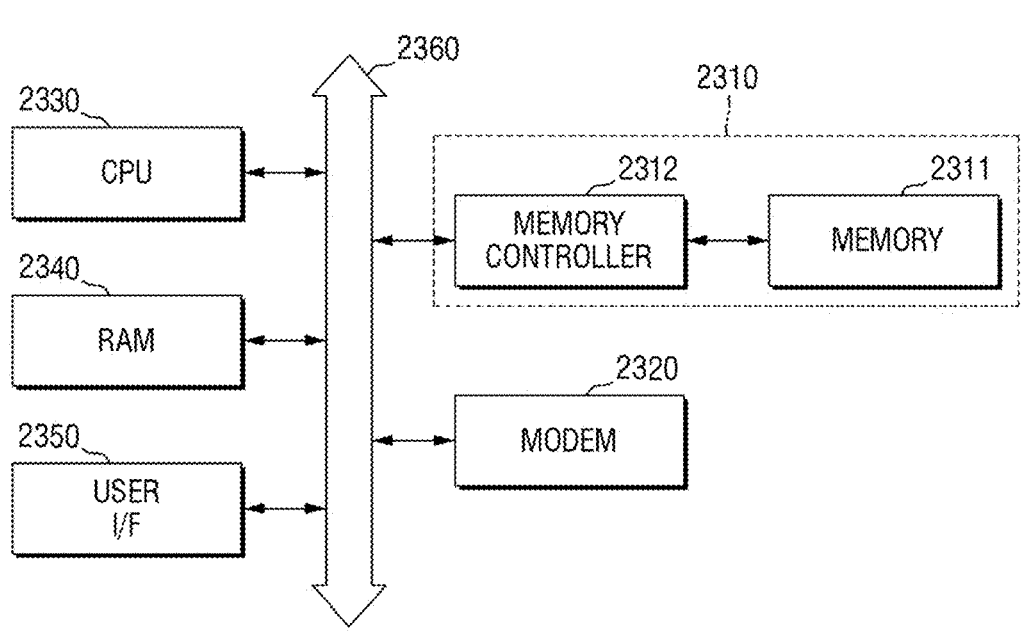
FIG. 20 is a block diagram illustrating an information processing system to which a semiconductor package according to some example embodiments of the present inventive concepts is applied.

FIG. 20 is a block diagram illustrating an information processing system to which the semiconductor package according to some example embodiments of the present inventive concepts is applied.

Referring to FIG. 20, the semiconductor devices/packages according to any of the example embodiments of the present inventive concepts may be applied to an information processing system 2300.

The information processing system 2300 may include a mobile device or a computer. The information processing system 2300 may include a memory system 2310, a modem 2320, a central processing unit 2330, a RAM 2340, and a user interface 2350 which are electrically connected to the system bus 2360. The memory system 2310 may include a memory 2311 and a memory controller 2312, and may be configured in substantially the same manner as a manner in which the memory card 2200 in FIG. 19 may be configured. Further, at least one of the central processing unit 2330 or the RAM 2340 may include at least one of the semiconductor devices/packages according to some example embodiments of the present inventive concepts.

Data processed by the central processing unit 2330 or data input from an external device may be stored in the memory system 2310. The information processing system 2300 may act as a memory card, a semiconductor disk device (Solid State Disk), a camera image processor, and other application chipsets. In one example, the memory system 2310 may be composed of a semiconductor disk device (SSD). In this case, the information processing system 2300 may store a large amount of data in the memory system 2310 stably and reliably, for example based on including at least one of the semiconductor devices/packages according to some example embodiments of the present inventive concepts.

As described herein, any devices, electronic devices, controllers, modules, units, and/or portions thereof according to any of the example embodiments, and/or any portions thereof (including, without limitation, memory card 2200, memory 2210, memory controller 2220, host 2230, SRAM 2221, central processing unit 2222, host interface 2223, error correction code 2224, memory interface 2225, information processing system 2300, memory system 2310, memory 2311, memory controller 2312, modem 2320, central processing unit 2330, RAM 2340, user interface 2350, or the like) may include, may be included in, and/or may be implemented by one or more instances of processing circuitry such as hardware including logic circuits; a hardware/ software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a micro-computer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, controllers, modules, units, and/or portions thereof according to any of the example embodiments.

Any of the memories described herein, including, without limitation, memory card 2200, memory 2210, SRAM 2221, memory system 2310, memory 2311, and/or RAM 2340 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Although some example embodiments of the present inventive concepts have been described with reference to the accompanying drawings, the present inventive concepts are not limited to such example embodiments and may have various different forms. Those of ordinary skill in the technical field to which the present inventive concepts belong will be able to understand that the present inventive concepts may be implemented in other specific forms without changing the technical idea or essential characteristics of the present inventive concepts. Therefore, it should be understood that example embodiments as described above are illustrative in all respects and not restrictive.

What is claimed is:

1. A semiconductor device, comprising:
   a substrate;
   an insulating layer on one face of the substrate, wherein the insulating layer has one or more inner surfaces at least partially defining a trench in the insulating layer;
   a via extending from a level within the substrate and extending through the one face of the substrate and a bottom face of the trench such that a portion of a sidewall of the via and a top face of the via are exposed through the substrate; and
   a pad contacting the exposed portion of the sidewall of the via and the exposed top face of the via, wherein the pad fills the trench,
   wherein the insulating layer includes a passivation layer on the one face of the substrate, and a protective layer on the passivation layer,
   wherein an etch stop layer is absent between the passivation layer and the protective layer such that the passivation layer and the protective layer are in direct contact with each other,
   wherein the passivation layer includes a first film disposed along the one face of the substrate and at least a portion of the sidewall of the via, and a second film disposed on the first film and separated from the portion of the sidewall of the via by the first film, and
   wherein a vertical level of the bottom face of the trench is higher than a vertical level of a bottom face of the second film and lower than a vertical level of a top face of the second film.

2. The semiconductor device of claim 1, wherein an angle between the bottom face of the trench and a side face of the trench is an obtuse angle.

3. The semiconductor device of claim 1, wherein
an angle between the bottom face of the trench and a side
face of the trench is a first angle,
an angle between the exposed portion of the sidewall of
the via and the bottom face of the trench is a second
angle, and
the first angle is greater than the second angle.

4. The semiconductor device of claim 1, wherein the top
face of the passivation layer and the top face of the via are
coplanar with each other.

5. The semiconductor device of claim 1, wherein the pad
includes:
a barrier layer formed conformally along a side face of the
trench and the bottom face of the trench, and along the
exposed portion of the sidewall and the exposed top
face of the via; and
a plated layer formed on the barrier layer, wherein the
plated layer fills the trench.

6. The semiconductor device of claim 5, wherein at least
a portion of a top face of the barrier layer is located at a
lower vertical level than the top face of the via.

7. The semiconductor device of claim 1, wherein the via
has a first width, the pad has a second width at a bottommost
face of the pad, and the pad has a third width at a topmost
face of the pad, wherein the second width is greater than the
first width, and the third width is greater than the second
width.

8. The semiconductor device of claim 1, wherein both the
vertical level of the bottom face of the trench and a vertical
level of a top face of the first film disposed along the portion
of the sidewall of the via are higher than the vertical level of
the bottom face of the second film and lower than the
vertical level of the top face of the second film.

9. A semiconductor device, comprising:
first and second devices bonded to each other,
wherein the first device includes
a first substrate;
a first insulating layer on a first face of the first substrate,
wherein the first insulating layer has one or more inner
surfaces at least partially defining a first trench in the
first insulating layer;
a first via extending from a level within the first substrate
and extending through the first face of the first substrate
and a first bottom face of the first trench such that a
portion of a sidewall of the first via and a top face of the
first via are exposed through the first substrate; and
a first pad contacting the exposed portion of the sidewall
of the first via and the exposed top face of the first via
and filling the first trench;
wherein the second device includes
a second substrate;
a second insulating layer on a second face of the second
substrate, wherein the second insulating layer has one
or more inner surfaces at least partially defining a
second trench in the second insulating layer;
a second via extending from a level within the second
substrate and extending through the second face of the
second substrate and a second bottom face of the
second trench such that a portion of a sidewall of the
second via and a top face of the second via are exposed
through the second substrate; and
a second pad contacting the exposed portion of the
sidewall of the second via and the exposed top face of
the second via and filling the second trench,
wherein the first insulating layer and the second insulating
layer are bonded to each other, and the first pad and the
second pad are bonded to each other, wherein the first insulating layer includes a passivation
layer on the first face of the first substrate,
wherein the passivation layer includes a first film disposed
along the first face of the first substrate and at least a
portion of the sidewall of the first via, and a second film
disposed on the first film and separated from the portion
of the sidewall of the first via by the first film, and
wherein a vertical level of a top face of the first film
disposed along the portion of the sidewall of the first
via is lower than a vertical level of a top face of the
second film.

10. The semiconductor device of claim 9, wherein an
angle between the first bottom face of the first trench and a
first side face of the first trench is an obtuse angle.

11. The semiconductor device of claim 9, wherein an
angle between the first bottom face of the first trench and a
first side face of the first trench is a first angle, an angle
between the exposed portion of the sidewall of the first via
and the first bottom face of the first trench is a second angle,
and the second angle is greater than the first angle.

12. The semiconductor device of claim 9, wherein
the first insulating layer further includes
a protective layer disposed on the passivation layer,
a top face of the passivation layer and the top face of the
first via are coplanar with each other.

13. The semiconductor device of claim 12, wherein
the first film of the passivation layer includes
an oxide film, and
the second film of the passivation layer includes a nitride
film.

14. The semiconductor device of claim 9, wherein the first
device includes a wafer or die, and the second device
includes a wafer or die.

15. A method for manufacturing a semiconductor device,
the method comprising:
forming an insulating layer on one face of a substrate,
wherein a via is formed in the substrate and the
insulating layer;
etching the insulating layer to form a trench therein,
wherein a portion of a sidewall of the via and a top face
of the via are exposed through the trench; and
forming a pad so as to contact the exposed top face of the
via and the exposed portion of the sidewall of the via
and so as to fill the trench,
wherein forming the insulating layer on the one face of the
substrate includes forming a passivation layer on the
one face of the substrate, wherein at least a part of the
sidewall of the via that is exposed through the substrate
is covered with the passivation layer and the top face of
the via is exposed through the passivation layer,
wherein the passivation layer includes a first film disposed
along the one face of the substrate and at least a portion
of the sidewall of the via, and a second film disposed
on the first film and separated from the portion of the
sidewall of the via by the first film, and
wherein a vertical level of a top face of the first film
disposed along the portion of the sidewall of the via is
lower than a vertical level of a top face of the second
film.

16. The method of claim 15, wherein an angle between a
bottom face of the trench and a side face of the trench is an
obtuse angle.

17. The method of claim 15, wherein an angle between a
bottom face of the trench and a side face of the trench is a
first angle, an angle between the exposed portion of the sidewall of the via and the bottom face of the trench is a second angle, and the first angle is greater than the second angle.

18. The method of claim 15, wherein forming the insulating layer on the one face of the substrate further includes:

forming a protective layer on the passivation layer and the top face of the via.

19. The method of claim 18, wherein forming the trench includes:

forming a mask pattern on a top face of the protective layer; and etching the protective layer and the passivation layer using the mask pattern to expose the portion of the sidewall of the via and the top face of the via.

20. The method of claim 19, wherein an etch stop layer is absent between the passivation layer and the protective layer such that the passivation layer and the protective layer are in direct contact with each other.

\* \* \* \* \*